United States Patent
Nemoto et al.

(10) Patent No.: US 7,323,963 B2
(45) Date of Patent: Jan. 29, 2008

(54) MRI SUPERCONDUCTIVE MAGNET

(75) Inventors: Takeo Nemoto, Kasumigaura (JP); Ryuya Ando, Hitachi (JP); Hiroyuki Watanabe, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/476,700

(22) Filed: Jun. 29, 2006

(65) Prior Publication Data

US 2007/0001792 A1    Jan. 4, 2007

(30) Foreign Application Priority Data

Jun. 30, 2005    (JP) .............................. 2005-190873

(51) Int. Cl.
*H01F 7/00*     (2006.01)
(52) U.S. Cl. ...................... 335/301; 335/216; 62/51.1
(58) Field of Classification Search ............... 335/216; 62/51.1
See application file for complete search history.

(56) References Cited

U.S. PATENT DOCUMENTS

| | | | | |
|---|---|---|---|---|
| 4,959,964 A * | 10/1990 | Saho et al. | ................... | 62/51.1 |
| 4,968,961 A * | 11/1990 | Miyajima et al. | ........... | 335/216 |
| 4,986,077 A * | 1/1991 | Saho et al. | ................... | 62/51.1 |
| 5,018,359 A * | 5/1991 | Horikawa et al. | ........... | 62/51.1 |
| 5,280,247 A * | 1/1994 | DeMeester et al. | ......... | 324/318 |
| 5,289,128 A * | 2/1994 | DeMeester et al. | ......... | 324/318 |
| 5,365,743 A * | 11/1994 | Nagao et al. | ................. | 62/47.1 |
| 5,396,173 A * | 3/1995 | Sakakura et al. | ........... | 324/318 |
| 5,517,169 A * | 5/1996 | Laskaris et al. | ............ | 335/301 |
| 5,571,602 A * | 11/1996 | Eckels et al. | ............ | 428/195.1 |
| 5,633,587 A * | 5/1997 | Hirumachi | ................... | 324/319 |
| 5,668,515 A * | 9/1997 | Ariyoshi | ...................... | 335/216 |
| 5,686,876 A * | 11/1997 | Yamamoto et al. | ......... | 335/216 |
| 5,701,744 A * | 12/1997 | Eckels et al. | ................. | 62/47.1 |
| 6,864,770 B2 * | 3/2005 | Nemoto et al. | ............. | 335/216 |
| 2003/0173964 A1 * | 9/2003 | Yoshino et al. | ............. | 324/307 |
| 2004/0185305 A1 * | 9/2004 | Nemoto et al. | ............. | 428/692 |
| 2007/0130961 A1 * | 6/2007 | Xu et al. | .......................... | 62/6 |

FOREIGN PATENT DOCUMENTS

| JP | 63-187606 | | 8/1988 |
|---|---|---|---|
| JP | 63187606 A | * | 8/1988 |
| JP | 02-195937 | | 8/1990 |

(Continued)

*Primary Examiner*—Elvin Enad
*Assistant Examiner*—Mohamad A Musleh
(74) *Attorney, Agent, or Firm*—Mattingly, Stanger, Malur & Brundidge, P.C.

(57) ABSTRACT

An object of the present invention is to provide a MRI superconductive magnet enables sharp images representing patients' health states to be produced.
[Means for Achieving the Object]

A MRI superconductive magnet having a superconductive coil, a liquid vessel of liquid helium used to cool the superconductive coil, a heat shield to accommodate the liquid vessel therein, a vacuum chamber to accommodate the heat shield therein, a load supporting body for supporting the superconductive coil from the vacuum chamber and securing the superconductive coil, a second cold part of a multi-stage refrigerator for cooling a heat exchanger to condense evaporated helium gas, and a first cold part of the multi-stage refrigerator for cooling the heat shield, wherein a magnetic shield is provided from the first cold part of the multi-stage refrigerator to an outer periphery of the second cold part of the multi-stage refrigerator.

6 Claims, 5 Drawing Sheets

FOREIGN PATENT DOCUMENTS

| | | |
|---|---|---|
| JP | 08-172012 | 7/1996 |
| JP | 08172012 A * | 7/1996 |
| JP | 11-155831 | 6/1999 |
| JP | 11155831 A * | 6/1999 |
| JP | 2004-235653 | 8/2004 |

* cited by examiner

MRI SUPERCONDUCTIVE MAGNET

CLAIM OF PRIORITY

The present application claims priority from Japanese application serial No. 2005-190873, filed on Jun. 30, 2005, the contents of which is hereby incorporated by references into this application.

BACKGROUND OF THE INVENTION

1. Field of Technology

The present invention relates to a magnetic resonance image (MRI) superconductive magnet.

2. Prior Art

A MRI superconductive magnet uses liquid helium to cool the a superconductive magnet. The liquid helium has a boiling point of as low as about 4.2 K, and therefore evaporates even when a small amount of heat enters. A technology of means for reducing the amount of evaporation from liquid helium is well known as Gifford-McMahon (GM) refrigerator which is used to recondense the evaporated gas to liquid and restore said liquid.

As for a magnetic shield as described in the Patent Document 1, "Superconductive Magnet", if electromagnetic force generated by a superconductive coil causes force to be applied to a displacer in which a magnetic substance is accommodated, a large load is applied to a motor for driving the displacer, and thus the refrigerator does not operate correctly. To avoid this problem, the magnetic shield is used to assure normal operation of the refrigerator by blocking the magnetic field of the superconductive magnet. The material of the magnetic shield used is iron.

If the magnetic shield is used for the MRI superconductive magnet, not only does the unit become large, but also its weight may increase because the magnetic shield is made of iron and must be thicker for use in a high magnetic field.

[Patent Document 1] Japanese Application Patent Laid-Open Publication No. 2004-235653

SUMMARY OF THE INVENTION

[Problems to be Solved by the Invention]

A key point in a MRI superconductive magnet system is the degree of sharpness of picture images representing the states of patients. A problem with the use of the GM refrigerator is that when the refrigerator is operated, the magnetic substance in the displacer moves, so the motion of the magnetic substance and the magnetic field of the superconductive coil cause overall inductive action, which prevents sharp images from being obtained.

An object of the present invention is to provide a MRI superconductive magnet enables sharp images representing patients' health states to be produced.

[Means for Solving the Problems]

The above object is achieved by the MRI superconductive magnet having a superconductive coil, a liquid vessel of liquid helium used to cool the superconductive coil, a heat shield to accommodate the liquid vessel therein, a vacuum chamber to accommodate the heat shield therein, a load supporting body for supporting the superconductive coil from the vacuum chamber and securing the superconductive coil, a second cold part of a multi-stage refrigerator for cooling a heat exchanger to condense evaporated helium gas, and a first cold part of the multi-stage refrigerator for cooling the heat shield, wherein a magnetic shield is provided from the first cold part of the refrigerator to an outer periphery of the second cold part of the refrigerator.

The above object is also achieved by providing a thermal anchor for interconnecting thermally the magnetic shield and the liquid helium in the liquid vessel.

The above object is also achieved by disposing the magnetic shield in the heat shield through a joint made of different materials.

The above object is also achieved by disposing the magnetic shield between the heat shield and the superconductive coil.

The above object is also achieved by connecting the magnetic shield thermally to the second cold part of the refrigerator.

The above object is also achieved by disposing the multi-stage refrigerator at an end of the superconductive magnet, disposing the magnetic shield between the first cold part, the second cold part of the refrigerator and the superconductive coil, and forming the magnetic shield with a single fan-like plate or a plurality of fan-like plates.

The above object is also achieved by accommodating the magnetic shield in the vacuum chamber.

[Effects of the Invention]

According to the present invention, a MRI superconductive magnet enables to produce sharp images representing patients' health states can be provided.

DETAILED DESCRIPTION OF THE INVENTION

Description of the Preferred Embodiments

An embodiment of the present invention will be described with reference to the drawings.

Embodiment 1

Figure 1:
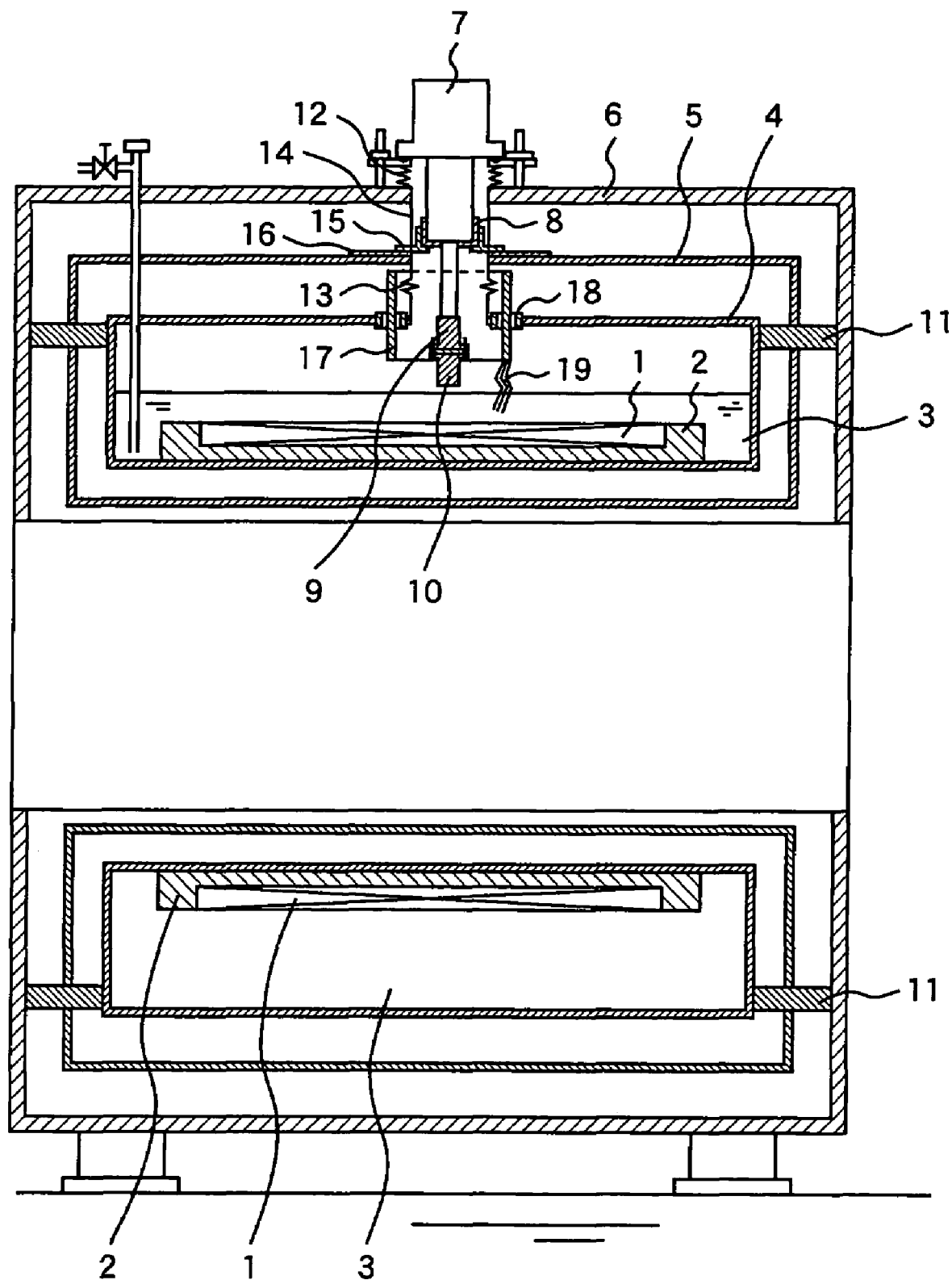
FIG. 1 is a cross-sectional view of a MRI superconductive magnet to implement an embodiment of the present invention.

FIG. 1 is a cross-sectional view of a MRI superconductive magnet to show an embodiment of the present invention.

In FIG. 1, a superconductive coil 1 is wound on a winding frame 2, which has a cylindrical shape and is placed horizontally. Liquid helium 3 used to cool the superconductive coil 1 is stored in a liquid vessel 4. A wire forming the superconductive coil 1 made of a superconductor, such as niobium or titanium, which is superconductive at a liquid helium temperature. A heat shield 5 is provided around the outer periphery of the liquid vessel 4. A superinsulator (not shown) to be attached to the outer surface of the heat shield 5 is attached to block radiant heat from a vacuum chamber 6 at room temperature.

The liquid helium 3 is used to cool the superconductive coil 1, but it evaporates due to conductive heat from a heat insulative load supporting body 11 to support the liquid vessel 4 and other parts and due to radiant heat from the surrounding. A refrigerator 7 is provided to liquefy the evaporated gas. The heat shield 5 and a heat exchanger 10 are attached to first cold part 8 and second cold part 9 of the refrigerator 7, respectively.

The heat exchanger 10 has the role of recondensing the evaporated helium gas to liquid and restoring said liquid. The material of the heat exchanger 10 is made of highly heat conductive material such as copper or aluminum; the heat exchanger 10 has been machined to have fins so that the cross sectional area is enlarged and the amount of liquefaction is increased.

If the refrigerator 7 is attached directly to the vacuum chamber 6, the vibration of the refrigerator 7 during its operation is transmitted from the vacuum chamber 6 to the superconductive coil 1 through the load supporting body 11, vibrating the superconductive coil 1. The vibration may prevent sharp images representing the states of patients from being produced. To avoid this, a bellows 12 is provided between the refrigerator 7 and vacuum chamber 6. A bellows 13 is disposed between the heat shield 5 and liquid vessel 4 so as to suppress the vibration of the refrigerator 7.

The refrigerator 7 usually needs maintenance service after it has been used for one year. The refrigerator 7 must be replaced quickly after maintenance service thereof is finished. The liquid vessel 4 is made hermetic by hermetically connecting the refrigerator 7, the vacuum chamber 6, the heat shield 5, the bellows 12, a pipe 14, heat transfer plates 15, 16, and a bellows 13. This hermetic structure simplifies attachment and removal of the refrigerator 7. The first cold part 8 of the refrigerator 7 and the heat transfer plate 15 are brought into mutual contact to cool the heat shield 5. The contact is achieved by vertical force provided by the refrigerator 7.

Reference numeral 17 indicates a magnetic shield. In this case, the material of the magnetic shield is pure aluminum. In order to attach the magnetic shield 17 to the liquid vessel 4, which is made of stainless steel, they are joined through a different-material joint 18 disposed therebetween. A thermal anchor 19, which is highly thermally conductive and is immersed into the liquid helium 3, is attached at the bottom end of the magnetic shield 17 so that the magnetic shield 17 is cooled to the temperature of the liquid helium. The magnetic shielding effect of the magnetic shield 17 is proportional to the electric conductivity. The electric conductivity of aluminum is reversely proportional to temperature. Accordingly, cooling the magnetic shield to increase the magnetic shielding effect is a useful way. Magnetic shields of other types of superconductors provide the same effect.

Embodiment 2

Figure 2:
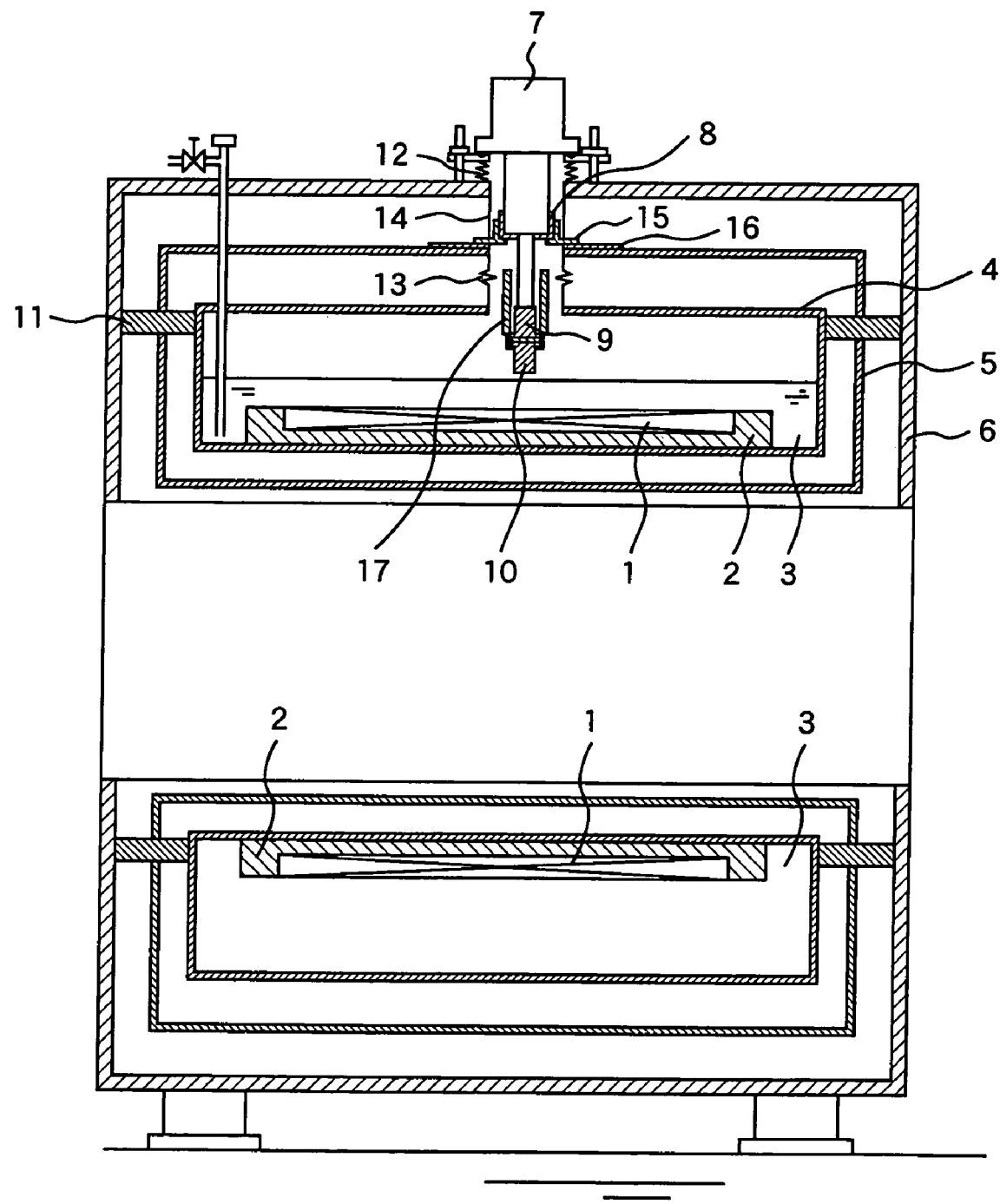
FIG. 2 is a cross-sectional view of the MRI superconductive magnet to implement another embodiment of the present invention.

FIG. 2 is a cross-sectional view of the MRI superconductive magnet to show second embodiment of the present invention.

In FIG. 2, the magnetic shield 17 is thermally connected to the second cold part 9. The magnetic shielding effect is increased by enlarging the heat transfer area of the heat exchanger 10 attached at a lower portion of the second cold part 9 and decreasing the temperature of the magnetic shield 17 to the lowest temperature.

Embodiment 3

Figure 3:
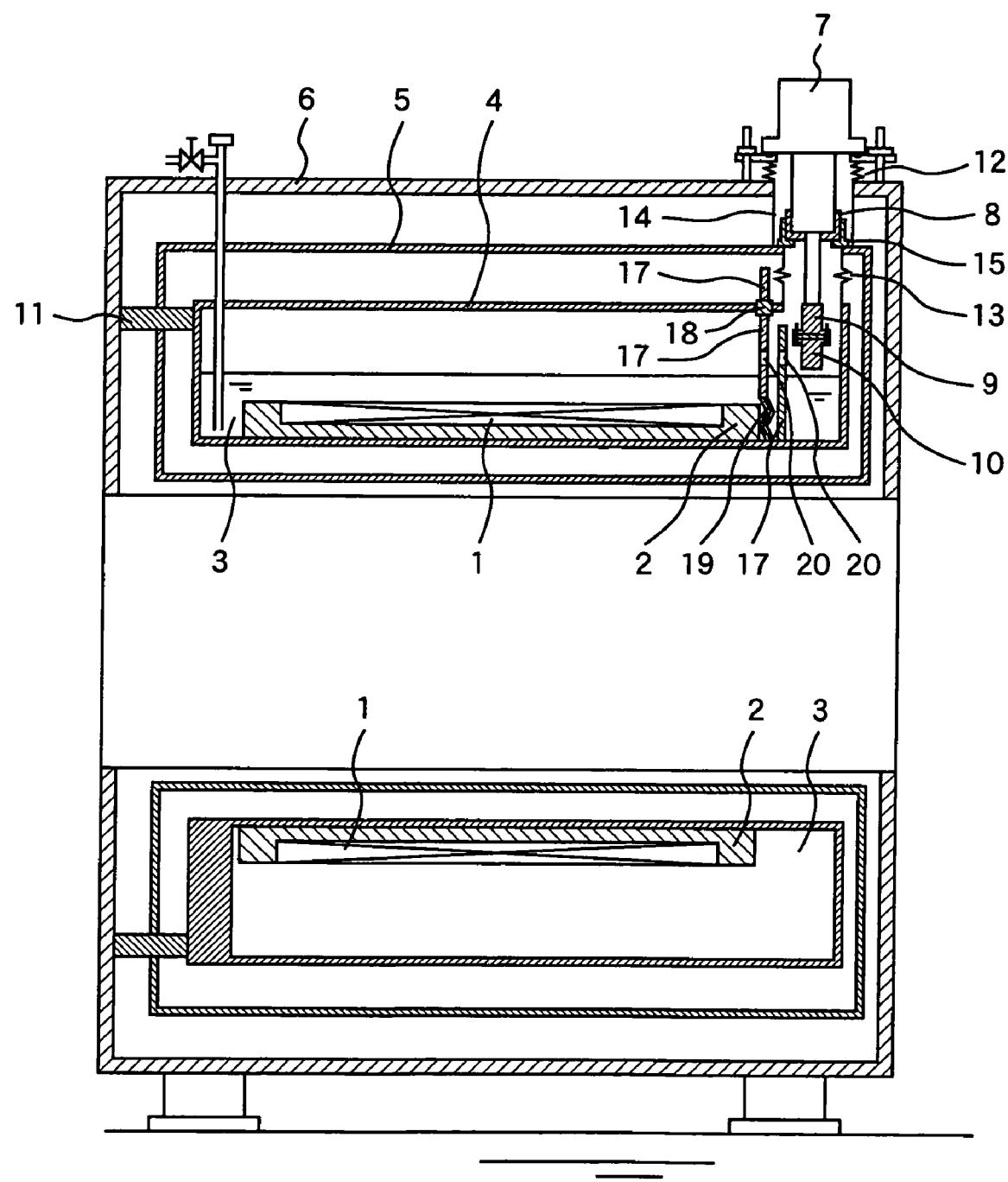
FIG. 3 is a cross-sectional view of the MRI superconductive magnet to implement another embodiment of the present invention.

FIG. 3 is a cross-sectional view of the MRI superconductive magnet to show third embodiment of the present invention.

In FIG. 3, the refrigerator 7 is placed close to the side of the vacuum chamber 6 with a cylindrical shape. In a magnetic field generated by the superconductive coil 1 with a horizontally cylindrical shape, the central part is usually high. Since both ends of the superconductive coil 1 with the horizontally cylindrical shape, are in a low magnetic field, the magnetic shielding effect is increased if the magnetic shield structure is the same.

The magnetic shield 17 is advantageous in that the magnetic shielding effect is increased because the magnetic shield 17 can be structured by laminating plate-like magnetic shields and the surface area of the magnetic shield 17 can be enlarged. Reference numeral 20 indicates a hole to keep surface level of the liquid helium 3 at a prescribed level.

Figure 4:
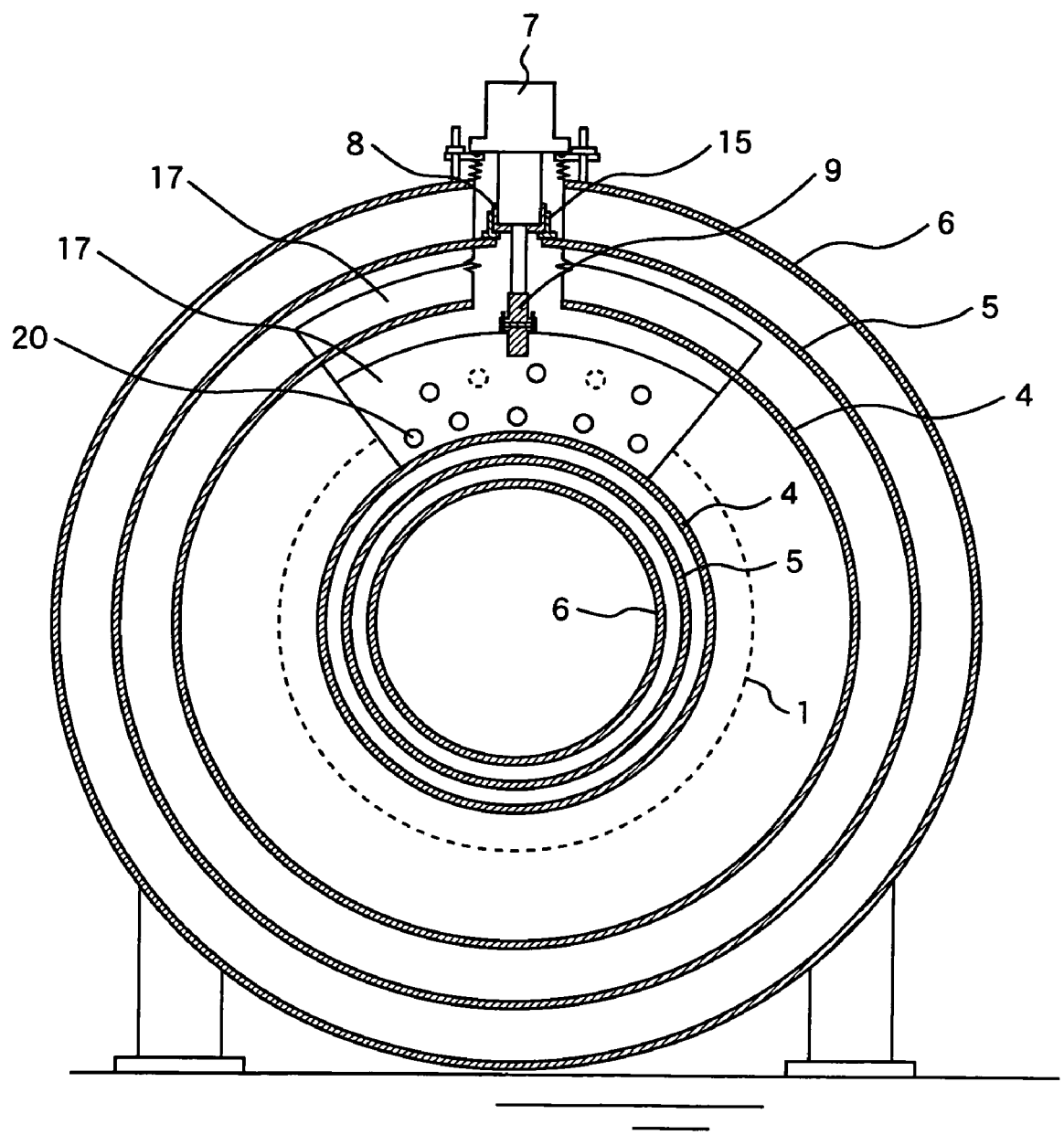
FIG. 4 is a cross-sectional view of the MRI superconductive magnet viewed from a side in FIG. 3.

FIG. 4 is a cross-sectional view of the superconductive magnet viewed from an end thereof.

The magnetic shield 17 in FIG. 4 is fan-shaped. The dead space of the superconductive magnet is used effectively, which is useful for downsizing the superconductive magnet. Reference numeral 20 indicates the hole to keep surface level of the liquid helium 3 at the prescribed level.

Although the magnetic shield of the present invention has been described by using the superconductive magnet with the horizontally cylindrical shape as an example, the magnetic shield 17 can also be applied to two superconductive magnets that overlap each other with the cylindrical axis being in the vertical direction.

Embodiment 4

Figure 5:
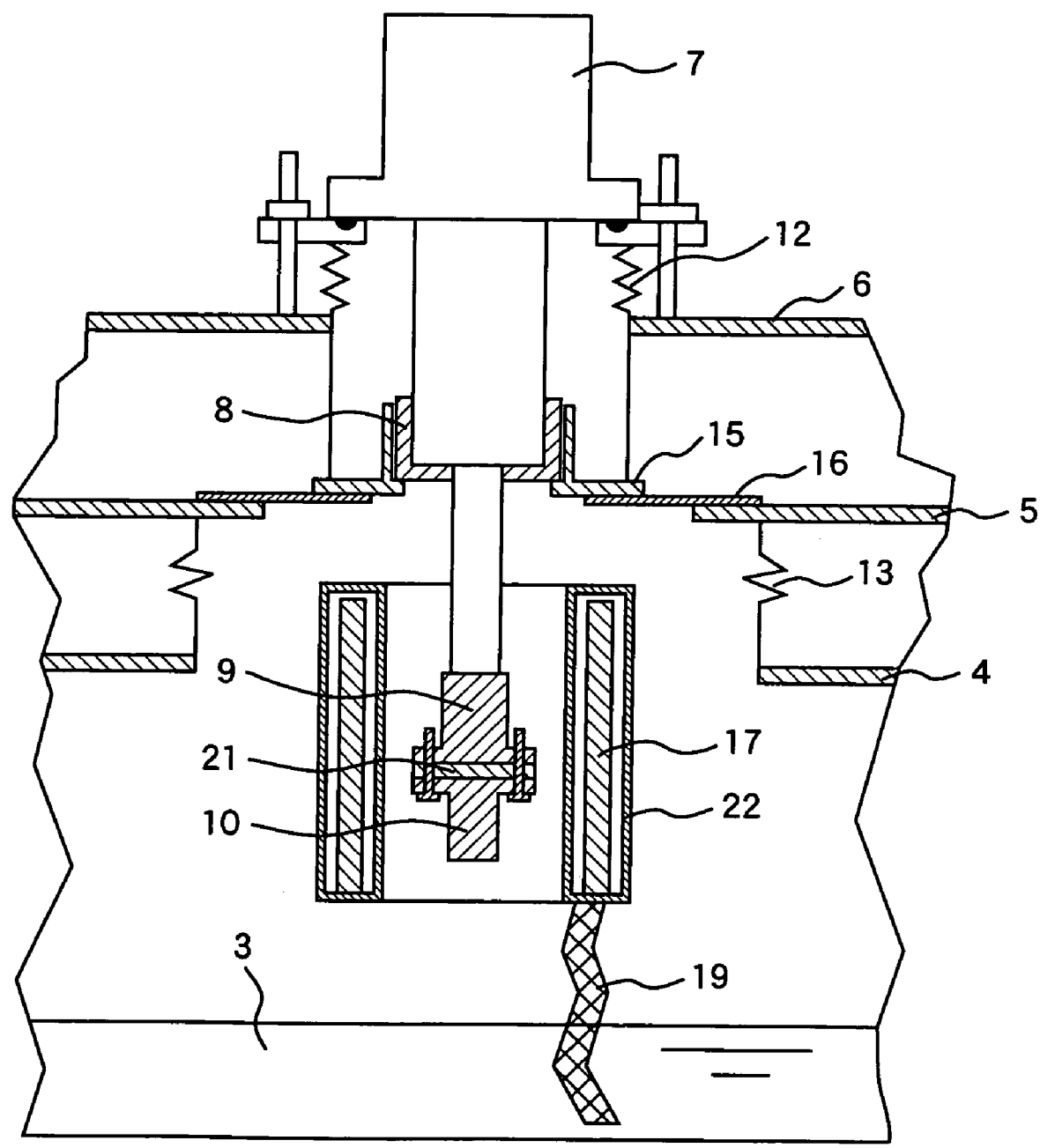
FIG. 5 is a cross-sectional view of the MRI superconductive magnet to implement another embodiment of the present invention.

FIG. 5 is a cross-sectional view of the MRI superconductive magnet to show fourth embodiment of the present invention.

If, in FIG. 5, the magnetic shield 17 placed close to the second cold part 9 is made of highly pure aluminum, the heat conductivity is high, uniforming the temperature of the helium gas near the magnetic shield. As a result, the temperature around the magnetic shield 17 is raised, and the amount of heat that enters the second cold part 9 is increased. At worst, the temperature of the heat exchanger 10 is raised, and reliquefaction becomes hard.

Therefore, a vacuum chamber 22 is placed around the outer periphery of the magnetic shield 17, preventing the temperature around the vacuum chamber 22 from being uniformed; the amount of heat that enters the second cold part 9 can then be kept small. This heat insulation effect becomes advantageous when the magnetic shield 17 and the second cold part 9 are close to each other.

Reference numeral 21 indicates an indium foil to be used for increasing the contact heat conductance between the heat exchanger 10 and the second cold part 9; it has an effect in increasing the cooling efficiency.

As with the MRI superconductive magnet that operates a refrigerator 7, the displacer in which a magnetic substance is accommodated, reciprocally moves up and down or right and left due to vibration, so inductive action with the magnetic field generated by the superconductive coil 1 may deteriorate the images representing the states of patients, as described above.

According to the present invention, to eliminate the inductive action, a magnetic shield 17 formed by a low resistive element including a superconductor is provided around the displacer. A thermal anchor 19 immersed in the liquid helium 3 is also attached to the magnetic shield 17 so as to cool the magnetic shield. The magnetic shielding effect is therefore increased.

Furthermore, another magnetic shield 17 is attached to the second cold part 9 enables the minimum temperature of the refrigerator 7 to be obtained, improving the magnetic shielding effect. Since the magnetic disturbance due to the inductive action is eliminated, the present invention has an effect in increasing the degree of sharpness of images representing the states of patients in the MRI.

What is claimed is:

1. A MRI superconductive magnet having a superconductive coil, a liquid vessel containing the superconductive coil and liquid helium used to cool the superconductive coil, a heat shield to accommodate the liquid vessel therein, a vacuum chamber accommodating the heat shield therein, a load supporting body supporting the liquid vessel in the vacuum chamber, and a multi-stage refrigerator extending through said heat shield and into said liquid vessel, the multi-stage refrigerator having a first cold part and a second cold part for cooling a heat exchanger in the liquid vessel for condensing evaporated helium gas, characterized in that:

a magnetic shield is provided inside of the heat shield extending from the first cold part of the multi-stage refrigerator to an outer periphery of the second cold part of the multi-stage refrigerator, and a thermal anchor is provided, arranged to directly interconnect thermally the magnetic shield and the liquid helium in the liquid vessel, wherein said magnetic shield is made of aluminum.

2. The MRI superconductive magnet according to claim 1, wherein the magnetic shield is disposed in the heat shield through a joint made of different materials.

3. The MRI superconductive magnet according to claim 1, wherein the magnetic shield is disposed between the heat shield and the superconductive coil.

4. The MRI superconductive magnet according to claim 1, wherein the magnetic shield is thermally connected to the second cold part of the multi-stage refrigerator.

5. The MRI superconductive magnet according to claim 1, wherein the multi-stage refrigerator is disposed at an end of the superconductive magnet, the magnetic shield extends from the first cold part of the multi-stage refrigerator and past the second cold part of the multi-stage refrigerator to the superconductive coil, and the magnetic shield is formed with a single fan-like plate or a plurality of fan-like plates.

6. The MRI superconductive magnet according to claim 1, wherein the magnetic shield is accommodated in the vacuum chamber.

* * * * *